(12) United States Patent
Asano et al.

(10) Patent No.: US 6,679,929 B2
(45) Date of Patent: Jan. 20, 2004

(54) POLISHING COMPOSITION AND POLISHING METHOD EMPLOYING IT

(75) Inventors: Hiroshi Asano, Aichi (JP); Kenji Sakai, Aichi (JP); Katsuyoshi Ina, Aichi (JP)

(73) Assignee: Fujimi Incorporated, Nishikasugai-gun (JP)

( * ) Notice: Subject to any disclaimer, the term of this patent is extended or adjusted under 35 U.S.C. 154(b) by 57 days.

(21) Appl. No.: 10/046,394

(22) Filed: Jan. 16, 2002

(65) Prior Publication Data

US 2002/0139055 A1 Oct. 3, 2002

(30) Foreign Application Priority Data

Jan. 31, 2001 (JP) ........................................ 2001-023316

(51) Int. Cl.⁷ ............................. C09G 1/02; C09G 1/04
(52) U.S. Cl. ............................. 51/308; 51/307; 51/309; 106/3; 438/692; 438/693
(58) Field of Search ........................... 51/307, 308, 309; 106/3; 438/692, 693

(56) References Cited

U.S. PATENT DOCUMENTS

| | | |
|---|---|---|
| 5,391,258 A | 2/1995 | Brancaleoni et al. |
| 5,428,721 A | 6/1995 | Sato et al. |
| 5,476,606 A | 12/1995 | Brancaleoni et al. |
| 5,575,885 A | 11/1996 | Hirabayashi et al. |
| 5,770,095 A | 6/1998 | Sasaki et al. |
| 5,858,813 A | 1/1999 | Scherber et al. |
| 5,954,997 A | 9/1999 | Kaufman et al. |
| 6,126,853 A | 10/2000 | Kaufman et al. |
| 6,315,803 B1 * | 11/2001 | Ina et al. ............ 51/307 |
| 6,355,075 B1 * | 3/2002 | Ina et al. ............ 51/308 |
| 6,440,186 B1 | 8/2002 | Sakai et al. |
| 2001/0008828 A1 * | 7/2001 | Uchikura et al. ........ 451/41 |

FOREIGN PATENT DOCUMENTS

| | | |
|---|---|---|
| EP | 0 659 858 | 6/1995 |
| EP | 0 846 742 | 6/1998 |

* cited by examiner

Primary Examiner—Michael Marcheschi
(74) Attorney, Agent, or Firm—Oblon, Spivak, McClelland, Maier & Neustadt, P.C.

(57) ABSTRACT

A polishing composition comprising the following components (a) to (g):

(a) at least one abrasive selected from the group consisting of silicon dioxide, aluminum oxide, cerium oxide, zirconium oxide and titanium oxide, (b) an aliphatic carboxylic acid, (c) at least one basic compound selected from the group consisting of an ammonium salt, an alkali metal salt, an alkaline earth metal salt, an organic amine compound and a quaternary ammonium salt, (d) at least one polishing accelerating compound selected from the group consisting of citric acid, oxalic acid, tartaric acid, glycine, α-alanine and histidine, (e) at least one anticorrosive selected from the group consisting of benzotriazole, benzimidazole, triazole, imidazole and tolyltriazole, (f) hydrogen peroxide, and (g) water.

13 Claims, No Drawings

POLISHING COMPOSITION AND POLISHING METHOD EMPLOYING IT

The present invention relates to a polishing composition to be used for polishing substrates for semiconductors, photomasks and various memory hard disks, particularly to a polishing composition useful for polishing for planarization of the surface of device wafers in e.g. semiconductor industry, and a polishing method employing such a composition.

More particularly, the present invention relates to a polishing composition which is highly efficient, provides high selectivity and is applicable to formation of excellent polished surface in the polishing of semiconductor devices to which so-called chemical mechanical polishing (hereinafter referred to as "CMP") technology is applied, in the processing of device wafers, and a polishing method employing such a composition.

Progress of so-called high technology products including computers has been remarkable in recent years, and parts to be used for such products, such as ULSI devices, have been developed for high integration and high speed, year after year. Along with such progress, the design rule for semiconductor devices has been progressively refined year after year, the depth of focus in a process for producing devices tends to be shallow, and planarization required for the pattern-forming surface tends to be increasingly severe.

Further, to cope with an increase in resistance of the wiring due to refinement of the wiring on the device, it has been studied to employ copper instead of tungsten or aluminum, as the wiring material. By its nature, copper is hardly processable by etching, and accordingly, it requires the following process.

Namely, after forming wiring grooves and vias on an insulating layer, copper wirings are formed by sputtering or plating (so-called damascene method), and then an unnecessary copper layer deposited on the insulating layer is removed by CMP process which is a combination of mechanical polishing and chemical polishing.

However, in such a process, it may happen that copper atoms will diffuse into the insulating layer to deteriorate the device properties. Therefore, for the purpose of preventing diffusion of copper atoms, it has been studied to provide a barrier layer on the insulating layer having wiring grooves or vias formed. As a material for such a barrier layer, metal tantalum or a tantalum compound such as tantalum nitride (hereinafter will generally be referred to as a tantalum-containing compound) is most suitable from the viewpoint of the reliability of the device and is expected to be employed mostly in the future.

Accordingly, in such a CMP process for a semiconductor device containing such a copper layer and a tantalum-containing compound, firstly the copper layer as the outermost layer and then the tantalum-containing compound layer as the barrier layer, are polished, respectively, and polishing will be completed when it has reached the insulating layer of e.g. silicon dioxide or monofluoro silicon oxide. As an ideal process, it is desired that by using only one type of a polishing composition, the copper layer and the tantalum-containing compound layer are uniformly removed by polishing in a single polishing step, and polishing will be completed certainly when it has reached the insulating layer.

However, copper and a tantalum-containing compound are different in their hardness, chemical stability and other mechanical properties and accordingly in the processability, and thus, it is difficult to adopt such an ideal polishing process. Accordingly, the following two step polishing process, i.e. polishing process divided into two steps, is being studied.

Firstly, in the first step polishing (hereinafter referred to as the first polishing), using a polishing composition capable of polishing a copper layer at a high efficiency, the copper layer is polished using e.g. a tantalum-containing compound layer as a stopper until such a tantalum-containing compound layer is reached. Here, for the purpose of not forming various surface damages such as recesses, erosion, dishing, etc., on the copper layer surface, the first polishing may be terminated immediately before reaching the tantalum-containing compound layer i.e. while a copper layer still slightly remains. Then, in the second step polishing (hereinafter referred to as the second polishing), using a polishing composition capable of polishing mainly a tantalum-containing compound layer at a high efficiency, the remaining thin copper layer and the tantalum-containing compound layer are polished using the insulating layer as a stopper, and polishing is completed when it has reached the insulating layer.

Here, dishing, recesses and erosion are surface damages due to excessive polishing of the wiring portion, caused by difference in hardness between a wiring layer (copper in this case) and the insulating layer or the tantalum-containing compound layer, by etching effect to the wiring layer, and mainly by a difference in pressure applied per unit area, respectively, and they decrease the cross-sectional area of the wiring layer. Accordingly, when a device is prepared, they tend to increase the resistance of the wiring at the corresponding portion, or they may cause contact failure in extreme cases. Accordingly, the polishing composition to be used in the first polishing is required to have a property such that it is capable of polishing the copper layer at a high stock removal rate without forming the above-mentioned various surface damages on the copper layer surface, which can not be removed by the second polishing.

With respect to such a polishing composition for a copper layer, for example, JP-A-7-233485 discloses a polishing liquid for a copper type metal layer, which comprises at least one organic acid selected from the group consisting of aminoacetic acid (hereinafter referred to as glycine) and amidesulfuric acid, an oxidizing agent and water, and a method for producing a semiconductor device using such a polishing liquid. Further, JP-A-8-83780 discloses an abrasive which contains aminoacetic acid and/or amidesulfuric acid, an oxidizing agent, water and benzotriazole or its derivative, and a method for producing a semiconductor device using such an abrasive.

However, as a result of the experiments conducted by the present inventors, it has been confirmed that when a copper layer having a pattern formed thereon is polished by using a polishing composition comprising only an abrasive, glycine and hydrogen peroxide, chemical etching effect on copper and erosion on the copper surface after the polishing tend to be significant, and deep recesses are likely to be formed. Further, in a case where benzotriazole having a function to suppress chemical etching effect on copper is incorporated in order to suppress erosion on the copper surface, if the addition amount of benzotriazole is too large, the stock removal rate of the copper layer tends to be significantly low, and the polishing takes long, such being inefficient.

Further, in a case where the addition amount of benzotriazole is too small, no adequate function to suppress chemical etching effect can be obtained, and it is thereby impossible to adequately suppress erosion on the copper surface. The present inventors have conducted experiments and reached such a conclusion that in a case of polishing a copper wiring by using a polishing composition comprising abrasive grains, glycine, benzotriazole and water, no composition can be found out for optimum polishing.

Namely, it has been strongly desired to develop a composition for polishing which has both properties of high stock removal rate of the copper layer and low chemical etching effect on the copper layer.

The present invention has been made to solve the above-described problems. Namely, it is an object of the present invention to provide a polishing composition, with which polishing can be carried out with a high stock removal rate of the copper layer while suppressing a chemical etching effect on the copper layer, in polishing of a wafer having a device pattern containing at least a layer of copper and a layer of a tantalum-containing compound formed on a substrate.

The present invention is to achieve the above-described object and resides in a polishing composition comprising the components (a) at least one abrasive selected from the group consisting of silicon dioxide, aluminum oxide, cerium oxide, zirconium oxide and titanium oxide, (b) an aliphatic carboxylic acid, (c) at least one basic compound selected from the group consisting of an ammonium salt, an alkali metal salt, an alkaline earth metal salt, an organic amine compound and a quaternary ammonium salt, (d) at least one polishing accelerating compound selected from the group consisting of citric acid, oxalic acid, tartaric acid, glycine, α-alanine and histidine, (e) at least one anticorrosive selected from the group consisting of benzotriazole, benzimidazole, triazole, imidazole and tolyltriazole, (f) hydrogen peroxide, and (g) water.

The present invention further provides the above polishing composition wherein the component (b) is an aliphatic monocarboxylic acid having one carboxyl group in a skeleton of a saturated hydrocarbon having a carbon number of at least 10 or a hydrocarbon having one unsaturated bond, and the above polishing composition wherein the component (b) is at least one member selected from the group consisting of lauric acid, linolic acid, myristic acid, palmitic acid, stearic acid and oleic acid.

The present invention further provides the above polishing composition wherein the component (c) is at least one member selected from the group consisting of ammonia, ethylenediamine, tetramethylammonium hydroxide, tetraethylammonium hydroxide, potassium hydroxide, sodium hydroxide, piperidine, piperazine and ethanolamine, and the above polishing composition wherein the component (e) is benzotriazole.

The present invention still further provides a polishing method for polishing a semiconductor device having at least a layer of copper and a layer of a tantalum-containing compound formed on a substrate, with the above polishing composition.

Usually as an abrasive, it has been known to use fine particles of e.g. an oxide, a nitride or a carbide of a metal. Particularly, at least one member selected from the group consisting of aluminum oxide, silicon oxide, cerium oxide, zirconium oxide and titanium oxide is used for the polishing composition of the present invention. Among them, preferred is silicon dioxide, more preferred is colloidal silica.

The concentration of the abrasive in the polishing composition of the present invention is usually from 0.2 to 250 g/l, preferably from 0.5 to 200 g/l, more preferably from 5 to 100 g/l. If the concentration of the abrasive is too low, mechanical polishing power tends to decrease, whereby the stock removal rate of the copper layer may decrease in some cases. On the other hand, if the concentration of the abrasive is too high, mechanical polishing power tends to increase, whereby the rate of polishing the tantalum-containing compound layer tends to be too high, and erosion are likely to form.

In the present invention, an aliphatic carboxylic acid is incorporated in order to suppress chemical etching effect on copper. It usually means a compound having at least one carboxyl group in a skeleton of a saturated hydrocarbon or an hydrocarbon having one unsaturated bond. Specifically, it may, for example, be lauric acid, linolic acid, myristic acid, palmitic acid, stearic acid, oleic acid, sebacic acid or dodecanedioic acid.

Among these aliphatic carboxylic acids, preferred is one having a carbon number of at least 10, more preferred is a so-called monocarboxylic acid having one carboxyl group. Further, among such compounds, one having a solubility of at most 0.2 g/100 g in water is preferred. From such a viewpoint, preferred as an aliphatic carboxylic acid is lauric acid, linolic acid, myristic acid, palmitic acid, stearic acid or oleic acid, and more preferred is oleic acid.

The addition amount of the aliphatic carboxylic acid is usually from 0.00003 to 0.005 mol/l, preferably from 0.0002 to 0.002 mol/l, based on the polishing composition. If the addition amount of the aliphatic carboxylic acid is less than 0.00003 mol/l, no adequate effect to suppress the chemical etching effect on the copper layer may be obtained. On the other hand, if the addition amount of the aliphatic carboxylic acid exceeds 0.005 mol/l, the stock removal rate of the copper layer tends to be too suppressed. Further, dissolution in the polishing composition tends to be difficult.

The polishing composition of the present invention contains at least one basic compound selected from the group consisting of an ammonium salt, an alkali metal salt, an alkaline earth metal salt, an organic amine compound and a quarternary ammonium salt. The basic compound is incorporated for the purpose of increasing the pH inclining to acid by addition of the aliphatic carboxylic acid and aiding dissolution of the aliphatic carboxylic acid in the polishing composition.

Specifically, the basic compound may, for example, be ammonia, ethylenediamine, tetramethylammonium hydroxide, tetraethylammonium hydroxide, potassium hydroxide, sodium hydroxide, piperidine, piperazine or ethanolamine. Among them, preferred are one which has a small etching effect on the copper layer and which is less likely to make abrasive grains agglomerate, and one which contains no other element as an impurity. From such a viewpoint, preferred is tetramethylammonium hydroxide.

The addition amount of the basic compound is preferably from 0.5 to 2, more preferably from 0.8 to 1.6, in equivalent ratio based on the aliphatic carboxylic acid to be incorporated at the same time. If the addition amount of the basic compound is less than 0.5 in equivalent ratio based on the aliphatic carboxylic acid, solubility of the aliphatic carboxylic acid tends to decrease, whereby dissolution of the aliphatic carboxylic acid tends to be difficult, or the aliphatic carboxylic acid is likely to deposit at a low temperature. On the other hand, if the addition amount of the basic compound exceeds 2 in equivalent ratio based on the aliphatic carboxylic acid, an etching effect on the copper layer tends to increase, such being unfavorable.

The polishing composition of the present invention contains at least one polishing accelerating compound selected from the group consisting of citric acid, oxalic acid, tartaric acid, glycine, a-alanine and histidine. Here, the "polishing accelerating compound" is a compound capable of making copper be further dissolved, by incorporating the polishing accelerating compound in a solution having hydrogen peroxide dissolved in pure water. Such a compound has a function to chelate copper to accelerate polishing of the copper layer.

Further, the addition amount is preferably from 0.1 to 2 mol/l, more preferably from 0.5 to 1 mol/l, based on the polishing composition. If the addition amount is less than 0.1 mol/l, the stock removal rate of the copper layer tends to be low. On the other hand, if it exceeds 2 mol/l, the stock removal rate of the copper layer tends to be too high, and control of polishing tends to be difficult, and due care will be required when the polishing composition is used.

The polishing composition of the present invention contains at least one anticorrosive selected from the group consisting of benzotriazole, benzimidazole, triazole, imidazole and tolyltriazole. The anticorrosive is one having a function to protect the copper layer surface during and after the polishing and to suppress erosion of copper. Particularly preferred is benzotriazole.

The addition amount is preferably from 0.0001 to 0.004 mol/l, more preferably from 0.0002 to 0.001 mol/l, based on the polishing composition. If the addition amount is less than 0.0001 mol/l, the copper layer surface after the polishing is likely to be eroded. On the other hand, if it exceeds 0.004 mol/l, the protective layer-forming function to the copper tends to be strong, whereby non-uniformity in polishing is likely to be led, or the stock removal rate of the copper tends to be excessively low, such being undesirable.

The polishing composition of the present invention contains hydrogen peroxide. Hydrogen peroxide functions as an oxidizing agent in the polishing composition of the present invention. Here, hydrogen peroxide has a characteristic such that one having a sufficient oxidizing power to oxidize the copper layer and containing no metal ion as an impurity, can readily be available, and thus it is particularly suitable for the polishing composition of the present invention.

The addition amount of hydrogen peroxide in the polishing composition of the present invention is preferably from 0.05 to 1.2 mol/l, more preferably from 0.15 to 0.6 mol/l, based on the polishing composition. If the addition amount of hydrogen peroxide is excessively small, or excessively large, the stock removal rate of the copper layer tends to be low, and due care will accordingly be required.

Further, the medium of the polishing composition of the present invention is water. Water is preferably one having impurities reduced as far as possible, so that the above-mentioned respective components can precisely perform their roles.

Namely, water is preferably distilled water, or one having impurity ions removed by an ion exchange resin and having suspended matters removed by a filter.

Accordingly, the polishing composition of the present invention is prepared usually by dissolving or dispersing the above-described respective components i.e. (a) the abrasive, (b) the aliphatic carboxylic acid, (c) the basic compound, (d) the polishing accelerating compound, (e) the anticorrosive and (f) hydrogen peroxide in (g) water.

Here, methods and order for dissolving or dispersing the respective components are optional. For example, stirring by a vane-type stirrer or supersonic dispersion may be employed. By such a method, the components other than the abrasive will be dissolved and the abrasive will be dispersed in water, whereby the composition will be a uniform dispersion. The polishing composition of the present invention may further contain a pH-adjusting agent to adjust the pH, various surfactants and other additives.

The basic compound is used for the purpose of increasing the pH of the polishing composition of the present invention as described above, and the pH-adjusting agent can further be used to improve the stability of the polishing composition, to improve the safety in use or to meet the requirements of various regulations.

On the other hand, as a pH-adjusting agent to be employed to lower the pH, besides the aliphatic carboxylic acid, hydrochloric acid, nitric acid, sulfuric acid, chloroacetic acid, etc., may be mentioned. The polishing composition of the present invention is not particularly limited with respect to the pH, but it is preferably adjusted to pH 3 to 10.

In the polishing composition of the present invention, the surfactant may further be used to increase the dispensability of the abrasive or to adjust the viscosity or the surface tension of the polishing composition. The surfactants include, for example, a dispersing agent, a wetting agent, a thickener, a defoaming agent, a foaming agent, a water repellent, etc. The surfactant to be used as a dispersing agent, may usually be of a sulfonic acid type, a phosphoric acid type, a carboxylic acid type or a nonionic type.

The polishing composition of the present invention may be prepared, stored or transported in the form of a stock solution having a relatively high concentration, so that it may be diluted for use at the time of actual polishing operation. The above-mentioned preferred range for the concentration is one for the actual polishing operation. Needless to say, in the case of adopting such a method of use, the stock solution during the storage or transportation is a solution having a higher concentration.

Further, hydrogen peroxide has a characteristic such that it decomposes in the presence of e.g. metal ions or ammonium ions. Accordingly, in the polishing composition of the present invention, it is advisable to add and mix it to the polishing composition immediately prior to the actual use for polishing operation. Such decomposition of hydrogen peroxide can be suppressed by the aliphatic carboxylic acid of the present invention to some extent, but it can be suppressed also by mixing another carboxylic acid or an alcohol. Further, it is possible to obtain such an effect by the above-mentioned pH-adjusting agent. However, such decomposition will be influenced also by the storage environment, and there is a possibility that part of hydrogen peroxide undergoes decomposition due to a temperature change during transportation or due to formation of a stress. Accordingly, it is preferred to mix hydrogen peroxide immediately before the polishing.

The most important point in the present invention is that the chemical etching effect is suppressed as far as possible without decreasing the stock removal rate of the copper layer, by incorporating an aliphatic carboxylic acid in the polishing composition. This is estimated to be effective to dissolve irregularity during the polishing and to suppress dishing and recesses.

In the polishing composition of the present invention, roles of the components other than the aliphatic carboxylic acid on the polishing of the copper are estimated below. Firstly, the abrasive serves to perform so-called mechanical polishing and accelerates polishing. Hydrogen peroxide oxidizes the copper surface to form a brittle oxidized layer.

Further, the polishing accelerating compound affects the oxidized copper surface to form a chelate with copper ions. Here, polishing of the copper proceeds by a combined effect of the chemical effect on copper of hydrogen peroxide and said compound and the mechanical effect of the abrasive. Further, the aliphatic carboxylic acid suppresses an excessive chemical etching effect on the copper. Further, the anticorrosive suppresses erosion of the copper surface after the polishing, and suppresses an excessive chemical etching effect on the copper as an additional effect. The basic compound aids dissolution of the aliphatic carboxylic acid in water to adjust the pH within a preferred range.

Now, the present invention will be described in detail with reference to Examples. However, it should be understood that the present invention is by no means restricted to such specific Examples.

EXAMPLES 1 TO 42 AND COMPARATIVE EXAMPLES 1 TO 4

Preparation of Polishing Compositions

Polishing compositions were prepared to have compositions as identified in Table 1. Namely, in Examples 1 to 6, the addition amounts of oleic acid, tetramethylammonium hydroxide, glycine, benzotriazole and hydrogen peroxide were constant respectively, and the concentration of colloidal silica alone was changed from 0.2 to 250 g/l. As the hydrogen peroxide, a commercially available 31% aqueous solution was employed, and it was mixed immediately before polishing.

Further, in Examples 7 to 13, the amount of oleic acid as the aliphatic carboxylic acid alone was changed within a range of from 0.00001 to 0.008 mol/l, and the concentration of the colloidal silica was constant at 50 g/l (the other components were the same as in Examples 1 to 6). Similarly, in Examples 14 to 19, the equivalent ratio of oleic acid to tetramethylammonium hydroxide alone was changed within a range of from 0.2 to 3. The other components and their amounts were constant.

In Examples 20 to 25, the addition amount of glycine alone was changed within a range of from 0.03 to 3 mol/l, in Examples 26 to 31, the amount of benzotriazole alone was changed within a range of from 0.0005 to 0.008 mol/l and in Examples 32 to 35, the amount of hydrogen peroxide alone was changed within a range of from 0.02 to 2 mol/l.

Further, Examples 36 to 41 are to compare properties in a case where the type of the aliphatic carboxylic acid was changed to lauric acid, myristic acid, palmitic acid, stearic acid, linolic acid or sebacic acid. The addition amount was constant at 0.0007 mol/l in each Example. Further, Example 42 is to compare properties in a case where potassium hydroxide was used as the basic compound, and the equivalent ratio to oleic acid was 1.3.

TABLE 1

| | Colloidal silica | Aliphatic carboxylic acid | | Basic compound | Aliphatic carboxylic acid/basic compound Equivalent ratio | Glycine | Benzotriazole | Hydrogen peroxide | Cu stock removal rate | Cu etching rate | Surface state after polishing |
|---|---|---|---|---|---|---|---|---|---|---|---|
| | g/l | Type | mol/l | Type | ratio | mol/l | mol/l | mol/l | Å/min | Å/min | |
| Ex. 1 | 0.2 | Ol | 0.0007 | TMAH | 1.3 | 0.5 | 0.0004 | 0.3 | 4,500 | 70 | ◎ |
| Ex. 2 | 0.5 | Ol | 0.0007 | TMAH | 1.3 | 0.5 | 0.0004 | 0.3 | 8,200 | 70 | ◎ |
| Ex. 3 | 5 | Ol | 0.0007 | TMAH | 1.3 | 0.5 | 0.0004 | 0.3 | 10,800 | 70 | ◎ |
| Ex. 4 | 100 | Ol | 0.0007 | TMAH | 1.3 | 0.5 | 0.0004 | 0.3 | 11,500 | 70 | ◎ |
| Ex. 5 | 200 | Ol | 0.0007 | TMAH | 1.3 | 0.5 | 0.0004 | 0.3 | 12,000 | 70 | ◎ |
| Ex. 6 | 250 | Ol | 0.0007 | TMAH | 1.3 | 0.5 | 0.0004 | 0.3 | 12,200 | 70 | ◎ |
| Ex. 7 | 50 | Ol | 0.00001 | TMAH | 1.3 | 0.5 | 0.0004 | 0.3 | 12,900 | 1,430 | Δ |
| Ex. 8 | 50 | Ol | 0.00003 | TMAH | 1.3 | 0.5 | 0.0004 | 0.3 | 12,200 | 960 | Δ |
| Ex. 9 | 50 | Ol | 0.0002 | TMAH | 1.3 | 0.5 | 0.0004 | 0.3 | 11,800 | 520 | ○ |
| Ex. 10 | 50 | Ol | 0.0007 | TMAH | 1.3 | 0.5 | 0.0004 | 0.3 | 11,000 | 70 | ◎ |
| Ex. 11 | 50 | Ol | 0.002 | TMAH | 1.3 | 0.5 | 0.0004 | 0.3 | 9,200 | 0 | ◎ |
| Ex. 12 | 50 | Ol | 0.004 | TMAH | 1.3 | 0.5 | 0.0004 | 0.3 | 6,900 | 0 | ◎ |
| Ex. 13 | 50 | Ol | 0.008 | TMAH | 1.3 | 0.5 | 0.0004 | 0.3 | 3,500 | 0 | ◎ |
| Ex. 14 | 50 | Ol | 0.0007 | TMAH | 0.2 | 0.5 | 0.0004 | 0.3 | 11,500 | 70 | ◎ |
| Ex. 15 | 50 | Ol | 0.0007 | TMAH | 0.5 | 0.5 | 0.0004 | 0.3 | 11,400 | 70 | ◎ |
| Ex. 16 | 50 | Ol | 0.0007 | TMAH | 1 | 0.5 | 0.0004 | 0.3 | 11,300 | 70 | ◎ |
| Ex. 17 | 50 | Ol | 0.0007 | TMAH | 1.6 | 0.5 | 0.0004 | 0.3 | 11,200 | 70 | ◎ |
| Ex. 18 | 50 | Ol | 0.0007 | TMAH | 2 | 0.5 | 0.0004 | 0.3 | 11,100 | 70 | ◎ |
| Ex. 19 | 50 | Ol | 0.0007 | TMAH | 3 | 0.5 | 0.0004 | 0.3 | 11,000 | 70 | ◎ |
| Ex. 20 | 50 | Ol | 0.0007 | TMAH | 1.3 | 0.03 | 0.0004 | 0.3 | 3,100 | 0 | ◎ |
| Ex. 21 | 50 | Ol | 0.0007 | TMAH | 1.3 | 0.1 | 0.0004 | 0.3 | 5,200 | 0 | ◎ |
| Ex. 22 | 50 | Ol | 0.0007 | TMAH | 1.3 | 0.5 | 0.0004 | 0.3 | 11,000 | 0 | ◎ |
| Ex. 23 | 50 | Ol | 0.0007 | TMAH | 1.3 | 1 | 0.0004 | 0.3 | 15,000 | 400 | ○ |
| Ex. 24 | 50 | Ol | 0.0007 | TMAH | 1.3 | 2 | 0.0004 | 0.3 | 16,000 | 850 | ○ |
| Ex. 25 | 50 | Ol | 0.0007 | TMAH | 1.3 | 3 | 0.0004 | 0.3 | 17,000 | 1,800 | Δ |
| Ex. 26 | 50 | Ol | 0.0007 | TMAH | 1.3 | 0.5 | 0.00005 | 0.3 | 12,200 | 1,500 | ○ |
| Ex. 27 | 50 | Ol | 0.0007 | TMAH | 1.3 | 0.5 | 0.0001 | 0.3 | 11,900 | 740 | ◎ |
| Ex. 28 | 50 | Ol | 0.0007 | TMAH | 1.3 | 0.5 | 0.0002 | 0.3 | 11,700 | 220 | ◎ |
| Ex. 29 | 50 | Ol | 0.0007 | TMAH | 1.3 | 0.5 | 0.001 | 0.3 | 10,200 | 30 | ◎ |
| Ex. 30 | 50 | Ol | 0.0007 | TMAH | 1.3 | 0.5 | 0.004 | 0.3 | 8,000 | 0 | ◎ |
| Ex. 31 | 50 | Ol | 0.0007 | TMAH | 1.3 | 0.5 | 0.008 | 0.3 | 2,700 | 0 | ◎ |
| Ex. 32 | 50 | Ol | 0.0007 | TMAH | 1.3 | 0.5 | 0.0004 | 0.05 | 2,300 | 10 | ◎ |
| Ex. 33 | 50 | Ol | 0.0007 | TMAH | 1.3 | 0.5 | 0.0004 | 0.15 | 5,400 | 40 | ◎ |
| Ex. 34 | 50 | Ol | 0.0007 | TMAH | 1.3 | 0.5 | 0.0004 | 0.6 | 9,100 | 80 | ◎ |
| Ex. 35 | 50 | Ol | 0.0007 | TMAH | 1.3 | 0.5 | 0.0004 | 1.2 | 7,400 | 90 | ○ |
| Ex. 36 | 50 | Lr | 0.0007 | TMAH | 1.3 | 0.5 | 0.0004 | 0.3 | 11,500 | 60 | ◎ |
| Ex. 37 | 50 | Ms | 0.0007 | TMAH | 1.3 | 0.5 | 0.0004 | 0.3 | 11,500 | 45 | ◎ |
| Ex. 38 | 50 | Pm | 0.0007 | TMAH | 1.3 | 0.5 | 0.0004 | 0.3 | 11,500 | 30 | ◎ |
| Ex. 39 | 50 | Sr | 0.0007 | TMAH | 1.3 | 0.5 | 0.0004 | 0.3 | 11,500 | 20 | ○ |
| Ex. 40 | 50 | Ln | 0.0007 | TMAH | 1.3 | 0.5 | 0.004 | 0.3 | 10,700 | 10 | ◎ |
| Ex. 41 | 50 | Sb | 0.0007 | TMAH | 1.3 | 0.5 | 0.0004 | 0.3 | 11,500 | 800 | ○ |
| Ex. 42 | 50 | Ol | 0.0007 | KOH | 1.3 | 0.5 | 0.0004 | 0.3 | 11,500 | 0 | ◎ |

TABLE 1-continued

|  | Colloidal silica | Aliphatic carboxylic acid | | Basic compound | Aliphatic carboxylic acid/basic compound Equivalent | Glycine | Benzotriazole | Hydrogen peroxide | Cu stock removal rate | Cu etching rate | Surface state after polishing |
|---|---|---|---|---|---|---|---|---|---|---|---|
|  | g/l | Type | mol/l | Type | ratio | mol/l | mol/l | mol/l | Å/min | Å/min |  |
| Comp. Ex. 1 | 50 | — | 0 | — | — | 0.5 | 0.0004 | 0.3 | 14,000 | 2,500 | X |
| Comp. Ex. 2 | 50 | — | 0 | TMAH | 0.0009 mol/l *) | 0.5 | 0.0004 | 0.3 | 14,000 | 2,500 | X |
| Comp. Ex. 3 | 50 | — | 0 | TMAH | 0.0009 mol/l *) | 0.5 | 0 | 0.3 | 15,000 | 3,500 | X |
| Comp. Ex. 4 | 50 | Ol | 0.0007 | TMAH | 1.3 | 0.5 | 0 | 0.3 | 13,000 | 150 | X |

Ol: oleic acid,
Lr: lauric acid,
Ms: myristic acid,
Pm: palmitic acid,
Sr: stearic acid,
Ln: linolic acid,
Sb: sebacic acid,
TMAH: tetramethylammonium hydroxide,
KOH: potassium hydroxide
*): The amount of the basic compound incorporated is shown as molecular concentration.

Polishing Tests

Polishing was carried out by means of a one side polishing machine for CMP (AVANTI472, manufactured by Speed Fam-IPEC, Inc.). To a table of the polishing machine, a laminated polishing pad made of polyurethane (IC-1000/Suba400, manufactured by Rodel Inc., U.S.A.) was bonded. The polishing conditions were such that the polishing pressure was 4 psi (about 280 g/cm$^2$), the table rotational speed was 70 rpm, the feed rate of the polishing composition was 250 cc/min, and the rotational speed of the carrier was 70 rpm.

As an object to be polished, a blanket wafer (8 inch) having a copper layer formed by electrolytic plating was used. Polishing was carried out for one minute, and the stock removal rate was calculated from the difference in layer thickness as before and after the polishing.

The etching rate of the copper layer was calculated from the difference in layer thickness as before and after the etching in such a manner that the blanket wafer having a copper layer formed by electrolytic plating was soaked in each of the polishing composition solutions and left to stand at a constant temperature of 25° C. for 3 minutes.

Further, the surface roughening and erosion state on the copper surface after the polishing were observed by an optical microscope and evaluated in accordance with the following standards.

⊚: No surface roughening nor erosion observed at all.
○: Slight surface roughening and erosion observed.
Δ: Surface roughening and erosion observed over the entire surface, but no problem in property.
X: Surface roughening or erosion is too severe for practical use.

The results are shown in Table 1 together with the compositions of the polishing compositions.

As evident from the results shown in Table 1, a good stock removal rate of copper of at least 5,000 Å/min was confirmed except for in Examples 1, 13, 20, 31 and 32. Further, with respect to the etching effect on the copper layer, a good etching suppression effect with a Cu etching rate of at most 1,000 Å/min was confirmed except for in Examples 7, 25 and 26. Further, the surface state after the polishing was good except for in Examples 7, 8 and 25.

It is found from Examples 1 to 6 that the stock removal rate of copper increases together with increase in the colloidal silica concentration, but there is fear that no adequate stock removal rate can be obtained at a concentration of 0.2 g/l and no efficient polishing may be carried out. Further, if the concentration is too high, the colloidal silica tends to aggregate. By taking them into consideration, the colloidal silica concentration is at a level of from 0.5 to 200 g/l, preferably from 5 to 100 g/l.

A small amount of the aliphatic carboxylic acid is preferred in view of the stock removal rate as mentioned above, but is unfavorable since the etching rate tends to increase. Further, if the addition amount is large, the stock removal rate tends to be low, such being unfavorable. By taking them into consideration, the addition amount of the aliphatic carboxylic acid is preferably from 0.00003 to 0.004 mol/l, more preferably from 0.0002 to 0.002 mol/l.

The addition amount of tetramethylammonium hydroxide has substantially no influence over the stock removal rate and the etching rate, but an optimum range is defined in view of easiness in handling and environmental consideration. Namely, in Example 14, oleic acid was hardly soluble and it took long to prepare the polishing composition. Further, in Example 19, addition of a large amount of an acid was required for neutralization at waste water treatment after the polishing. By taking them into consideration, tetramethylammonium hydroxide is from 0.5 to 2, preferably from 1 to 1.6, in equivalent ratio based on the aliphatic carboxylic acid.

With respect to the influence of the addition amount of glycine over the stock removal rate of copper, if the addition amount was at most 0.03 mol/l, the stock removal rate was at most 5,000 Å/min and was extremely low, and it is considered that there is a problem in view of productivity. On the other hand, with respect to the etching rate, if the addition amount was at least 3 mol/l, the etching rate was 1,000 Å/min and was extremely high, and there is fear of formation of excessive recesses. The addition amount is from 0.1 to 2 mol/l, preferably at a level of from 0.5 to 1 mol/l.

As described above, if the addition amount of benzotriazole is too small, copper layer surface roughening occurs due to erosion on the surface of the copper layer, and if it is too large, the stock removal rate of copper tends to be extremely low. Accordingly, the addition amount is considered to be suitably from 0.0001 to 0.004 mol/l, preferably from 0.0002 to 0.001 mol/l.

If the addition amount of hydrogen peroxide is extremely small, the stock removal rate tends to be low, such being undesirable. On the other hand, if the addition amount is large, there is no particular problem from the viewpoint of the evaluation results, but addition of excess amount more than necessary is uneconomical, and accordingly the addition amount is preferably from 0.15 to 0.6 mol/l.

It was found from the results of Examples 36 to 40, the stock removal rate, the etching rate and the results of the observation of the surface state were good also in a case where lauric acid, linolic acid, myristic acid, palmitic acid, stearic acid or sebacic acid was used instead of oleic acid as the aliphatic carboxylic acid. Substantially no difference in properties was confirmed in a case where potassium hydroxide which is a common inorganic alkali was used as a material showing alkalinity.

According to the present invention, in a CMP process of a semiconductor device having at least a copper layer and a tantalum-containing compound layer, the etching rate of copper can be suppressed without impairing the stock removal rate of copper, by incorporating an aliphatic carboxylic acid into a polishing composition.

Namely, in polishing of a semiconductor device having at least a layer of copper and a layer of a tantalum-containing compound formed on a substrate, it is possible to suppress the etching rate of copper without impairing the stock removal rate of copper, by means of 1) the polishing composition of the present invention comprising (a) an abrasive, (b) an aliphatic carboxylic acid, (c) a basic compound, (d) a polishing accelerating compound, (e) an anticorrosive, (f) hydrogen peroxide and (g) water.

Further, polishing of a semiconductor device, wherein the etching rate of copper can be suppressed without impairing the stock removal rate of copper in an extremely stable state, can be expected by means of 2) the above polishing composition wherein the component (b) is an aliphatic monocarboxylic acid having one carboxyl group in a skeleton of a saturated hydrocarbon having a carbon number of at least 10 or a hydrocarbon having one unsaturated bond, or 3) the polishing composition of the present invention wherein the component (b) is at least one member selected from the group consisting of lauric acid, linolic acid, myristic acid, palmitic acid, stearic acid and oleic acid.

Further, polishing of a semiconductor device can be carried out wherein the etching rate of copper can be suppressed without impairing the stock removal rate of copper in a stable state while maintaining a proper pH, by means of 4) the polishing composition of the present invention wherein the component (c) is at least one member selected from the group consisting of ammonia, ethylenediamine, tetramethylammonium hydroxide, tetraethylammonium hydroxide, potassium hydroxide, sodium hydroxide, piperidine, piperazine and ethanolamine, or 5) the polishing composition of the present invention wherein the component (e) is benzotriazole.

Further, it becomes possible to provide a semiconductor device having extremely few surface damages economically with a high efficiency, by means of 6) the polishing method of the present invention using the above polishing composition.

The entire disclosure of Japanese Patent Application No. 2001-23316 filed on Jan. 31, 2001 including specification, claims, drawings and summary are incorporated herein by reference in its entirety.

What is claimed is:

1. A polishing composition comprising the following components (a) to (g):
   (a) at least one abrasive selected from the group consisting of silicon dioxide, aluminum oxide, cerium oxide, zirconium oxide and titanium oxide,
   (b) an aliphatic carboxylic acid having at least 10 carbon atoms,
   (c) at least one basic compound selected from the group consisting of ammonia, an ammonium salt, an alkali metal salt, an alkaline earth metal salt, an organic amine compound and a quaternary ammonium salt, wherein salts include hydroxides,
   (d) at least one polishing accelerating compound selected from the group consisting of citric acid, oxalic acid, tartaric acid, glycine, α-alanine and histidine,
   (e) at least one anticorrosive selected from the group consisting of benzotriazole, benzimidazole, triazole, imidazole and tolyltriazole,
   (f) hydrogen peroxide, and
   (g) water.

2. The polishing composition according to claim 1, wherein the component (b) is an aliphatic monocarboxylic acid having one carboxyl group in a skeleton of a saturated hydrocarbon or a hydrocarbon having one unsaturated bond.

3. The polishing composition according to claim 1, wherein the component (b) is at least one member selected from the group consisting of lauric acid, linolic acid, myristic acid, palmitic acid, stearic acid and oleic acid.

4. The polishing composition according to claim 1, wherein the component (c) is at least one member selected from the group consisting of ammonia, ethylenediamine, tetramethylammonium hydroxide, tetraethylammonium hydroxide, potassium hydroxide, sodium hydroxide, piperidine, piperazine and ethanolamine.

5. The polishing composition according to claim 1, wherein the component (e) is benzotriazole.

6. A polishing method for polishing a semiconductor device having at least a layer of copper and a layer of a tantalum-containing compound formed on a substrate, comprising polishing the semiconductor with the polishing composition as defined in claim 1.

7. The polishing composition according to claim 1, comprising, in amounts based on the composition:
   (a) in an amount of from 0.2 to 250 g/l,
   (b) in an amount of from 0.00003 to 0.005 mol/l,
   (c) in an amount of from 0.5 to 2, in equivalent ratio based on (b),
   (d) in an amount of from 0.1 to 2 mol/g,
   (e) in an amount of from 0.0001 to 0.004 mol/l,
   (f) in an amount of from 0.05 to 1.2 mol/l.

8. A composition in concentrated form containing the following components (a)–(g):
   (a) at least one abrasive selected from the group consisting of silicon dioxide, aluminum oxide, cerium oxide, zirconium oxide and titanium oxide,
   (b) an aliphatic carboxylic acid having at least 10 carbon atoms,
   (c) at least one basic compound selected from the group consisting of ammonia, an ammonium salt, an alkali metal salt, an alkaline earth metal salt, an organic amine compound and a quaternary ammonium salt, wherein salts include hydroxides, (d) at least one polishing accelerating compound selected from the group consisting of citric acid, oxalic acid, tartaric acid, glycine, α-alanine and histidine, (e) at least one anticorrosive selected from the group consisting of benzotriazole, benzimidazole, triazole, imidazole and tolyltriazole, (f) optionally, hydrogen peroxide, and (g) optionally, water.

9. The polishing composition according to claim 1, wherein component (a) is colloidal silica.

10. The polishing composition according to claim 3, wherein component (b) is oleic acid.

11. The polishing composition according to claim 4, wherein component (c) is tetramethylammonium hydroxide.

12. The polishing composition according to claim 1, wherein component (d) is glycine.

13. A composition in concentrated form containing the following components (a)–(g):

(a) at least one abrasive selected from the group consisting of silicon dioxide, aluminum oxide, cerium oxide, zirconium oxide and titanium oxide, (b) an aliphatic carboxylic acid having at least 10 carbon atoms, (c) at least one basic compound selected from the group consisting of ammonia, an ammonium salt, an alkali metal salt, an alkaline earth metal salt, an organic amine compound and a quaternary ammonium salt, wherein salts include hydroxides, (d) at least one polishing accelerating compound selected from the group consisting of glycine, α-alanine and histidine, (e) at least one anticorrosive selected from the group consisting of benzotriazole, benzimidazole, triazole, imidazole and tolyltriazole, (f) optionally, hydrogen peroxide, and (g) optionally, water.

* * * * *